(12) United States Patent
Zheng et al.

(10) Patent No.: US 7,622,373 B2
(45) Date of Patent: Nov. 24, 2009

(54) MEMORY DEVICE HAVING IMPLANTED OXIDE TO BLOCK ELECTRON DRIFT, AND METHOD OF MANUFACTURING THE SAME

(75) Inventors: Wei Zheng, Santa Clara, CA (US); Chungho Lee, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/615,563

(22) Filed: Dec. 22, 2006

(65) Prior Publication Data

US 2008/0150001 A1    Jun. 26, 2008

(51) Int. Cl.
*H01L 21/425* (2006.01)
(52) U.S. Cl. ............... 438/514; 438/257; 438/279
(58) Field of Classification Search ............ 438/262, 438/280, 514
See application file for complete search history.

(56) References Cited

U.S. PATENT DOCUMENTS

| 6,596,593 | B2 * | 7/2003 | Ishii ........................... 438/275 |
| 6,987,048 | B1 * | 1/2006 | Cheng et al. ................. 438/262 |
| 2003/0111699 | A1 * | 6/2003 | Wasshuber et al. .......... 257/414 |

* cited by examiner

*Primary Examiner*—Thao X Le
*Assistant Examiner*—Kimberly Trice

(57) ABSTRACT

A memory device includes a substrate, a first gate stack overlying the substrate, a second gate stack overlying the substrate and spaced apart from the first gate stack, an oxide region formed at a first depth within the substrate and between the first and second gate stacks, and an impurity doped region formed at a second depth within the substrate and between the first and second gate stacks, the first depth being lower than the second depth.

18 Claims, 3 Drawing Sheets

US 7,622,373 B2

MEMORY DEVICE HAVING IMPLANTED OXIDE TO BLOCK ELECTRON DRIFT, AND METHOD OF MANUFACTURING THE SAME

FIELD OF THE INVENTION

The present invention generally relates to flash memory devices, and more particularly relates to methods for fabricating memory devices with reduced transient program disturb.

BACKGROUND OF THE INVENTION

A type of commercially available flash memory product is a MirrorBit® memory device available from Spansion, LLC. A MirrorBit® cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

An exemplary MirrorBit® memory device 10, illustrated in FIG. 1, includes a P-type semiconductor substrate 12 within which is formed a plurality of spaced-apart source and drain regions 14 and 16, respectively, otherwise known as bit lines. Typically, the substrate 12 has P-type conductivity, and both of the bit lines 14 and 16 have N-type conductivity. A charge trapping layer or stack 18 is disposed on the top surface of the substrate 12 between the bit lines 14 and 16. The charge trapping stack 18 typically comprises, for example, a charge trapping layer, often a silicon nitride layer 20, disposed between a first or bottom silicon dioxide layer (commonly referred to as a tunnel oxide layer) 22 and a second or top silicon dioxide layer 24. A control gate electrode 26, which typically includes an N or N+ polysilicon layer, is formed over the charge trapping stack to form a first storage element or bit 28 and a second storage element or bit 30 of memory cells 32 and 34.

A dual bit memory cell, such as cell 34, is programmed utilizing a procedure known as a hot electron injection technique. More specifically, programming the first bit 28 of the memory cell 34 is performed by injecting electrons into the charge trapping layer 20 and applying a bias between the bit lines 14 and 16 while applying a high voltage to the control gate electrode 26. In an exemplary embodiment, this is accomplished by grounding bit line 16 and applying, for example, approximately 3 to 5 V to bit line 14 and approximately 8 to 10 V to the control gate electrode 26. The voltage on the control gate electrode 26 inverts a channel region 36 while the bias accelerates electrons from bit line 16 into the channel region 36 towards bit line 14. The 4.5 eV to 5 eV kinetic energy gain of the electrons is more than sufficient to surmount the 3.1 eV to 3.5 eV energy barrier at channel region 36/tunnel oxide layer 22 interface and, while the electrons are accelerated towards bit line 16, the field caused by the high voltage on control gate 26 redirects the electrons towards the charge trapping layer 20 in the first bit 28. Those electrons that cross the interface into the charge trapping layer 20 remain trapped for later reading.

Similarly, programming the second bit 30 by hot electron injection into the charge trapping layer 20 is performed by applying a bias between the bit lines 16 and 14 while applying a high voltage to the control gate 26. This may be accomplished by grounding bit line 14 and applying approximately 3 to 5V to bit line 16 and approximately 8 to 10 V to the control gate 26. The voltage on the control gate 26 inverts the channel region 36 while the bias accelerates electrons from bit line 14 into the channel region 36 towards bit line 16. The field caused by the high voltage on control gate 26 redirects the electrons toward the charge trapping layer 20 of second bit 30. Those electrons that cross the channel region 36/tunnel oxide layer 22 into the charge trapping layer 20 remain trapped for later reading.

Advances in semiconductor processing technology often are directed toward increasingly smaller devices, including memory devices. However, as the above described cells are scaled smaller in size, a transient program disturb phenomenon becomes a challenging obstacle. Transient program disturb results during programming of the dual bit devices. For example, hot holes generated when programming the first bit 28 of an adjacent memory cell 32 have a secondary impact ionization below bit line 16. Freed electrons resulting from the secondary impact ionization tend to diffuse to the disturbed cell 34 below the gate 26, as represented by arrow 40, where they are accelerated by the drain depletion region and injected into the charge trapping stack 18 of both bit 28 and bit 30 of the disturbed cell. This injection of secondary electrons into the charge trapping stack 18 may adversely affect the memory window of the second bit 30.

Accordingly, it is desirable to provide a flash memory device that reduces transient program disturb. In addition, it is desirable to provide a dual bit memory device with dual bit memory cells that can be reliably programmed. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A memory device is provided having improved transient program disturb. The memory device includes a substrate, a first gate stack overlying the substrate, a second gate stack overlying the substrate and spaced apart from the first gate stack, an oxide region formed at a first depth within the substrate and between the first and second gate stacks, and an impurity doped region formed at a second depth within the substrate and between the first and second gate stacks, the first depth being lower than the second depth.

A method is also provided for manufacturing a memory device having improved transient program disturb features. First, a first gate stack and a second gate stack are formed overlying a substrate. An oxide region is then formed at a first depth within the substrate and between the first and second gate stacks. Finally, an impurity doped region is formed at a second depth within the substrate and between the first and second gate stacks, the first depth being lower than the second depth.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with an exemplary embodiment of the present invention, FIGS. 2 to 5 are cross-sectional views illustrating an exemplary method for fabricating a memory device, such as a dual bit memory device, that can be scaled with decreased device dimensions while overcoming challenges of transient program disturb. Various steps in the manufacture of a flash memory device are well known and so, in the interest of brevity, many conventional steps will only be mentioned briefly herein or will be omitted entirely without providing well known process details.

Figure 1:
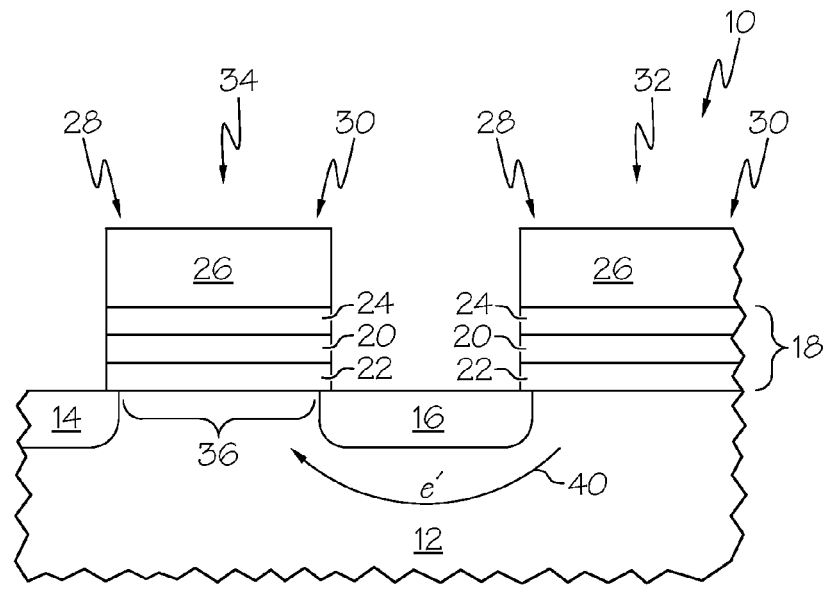
FIG. 1 is a cross-sectional view of a portion of a conventional dual bit memory device.
Figure 2:
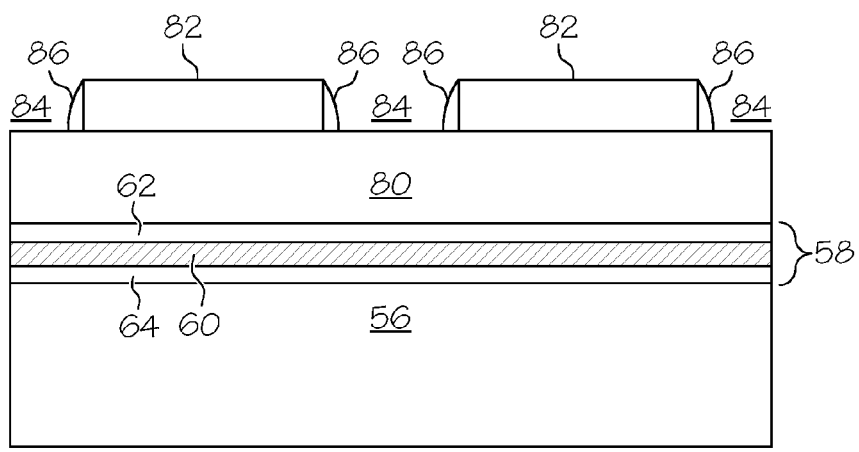
FIGS. 2 to 6 are cross-sectional views illustrating a method for fabricating a dual bit memory device according to an embodiment of the invention.

As illustrated in FIG. 2, an exemplary manufacturing process begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly or be grown into the substrate. The silicon substrate 56 may be a bulk silicon wafer or a thin layer of silicon on an insulating layer (commonly known as a silicon-on-insulator wafer or SOI wafer) that, in turn, is supported by a silicon carrier wafer.

A first oxide layer 64, a nitride layer 60, and a second oxide layer 62 are formed to overly the substrate 56 and together form a multi-layer dielectric-charge trapping-dielectric stack 58, referred to conventionally as a multilayer ONO stack. The two layers may be formed using any suitable steps and materials, including oxidation and/or deposition techniques as are known, such as thermal deposition, chemical vapor deposition (CVD), low pressure chemical vapor deposition (LPCVD), plasma enhanced chemical vapor deposition (PECVD), and atomic layer deposition (ALD). In the case of oxide dielectrics, either of the oxide layers 62 and 64 may include nitrogen or other dopants to optimize device and reliability performance. In addition, the nitride layer 60 may be rich in Si, N, and/or dopants such as oxygen to facilitate enhanced device performance and reliability. The layers in the multilayer stack 58 may be formed from any suitable dielectric-charge trapping-dielectric stack materials. Such materials include silicon oxide to form each of the oxide layers 62 and 64, and silicon nitride to form the nitride layer 60. In an exemplary embodiment, the first oxide layer 64 has a thickness ranging between about 20 and about 80 Å, the nitride layer 60 has a thickness ranging between about 50 and about 100 Å, and the second oxide layer has a thickness ranging between about 50 and about 150 Å.

A control gate material layer 80 is deposited overlying the multi-layer stack 58. The control gate material is a conductive material, such as a conductive metal. A preferred control gate material is polycrystalline silicon, which may be deposited as an impurity doped layer, but is preferably deposited as undoped polycrystalline silicon and is subsequently impurity doped by ion implantation. The control gate material layer 80 may is deposited to an exemplary thickness ranging between about 300 Å and about 1200 Å by LPCVD by the hydrogen reduction of silane ($SiH_4$), and preferably has a thickness of about 1000 Å.

A hard masking layer 82 is deposited and patterned to aid in subsequently patterning the control gate material layer 80 and the underlying multi-layer stack 58. Exemplary hard masking layer materials include antireflective coating materials including silicon nitride, silicon oxide, and silicon oxynitride. The hard masking layer 82 is deposited to an exemplary thickness of about 50 nm using a suitable deposition process such as LPCVD. The hard masking layer 82 is patterned using conventional photolithography techniques to form openings 84. A non-illustrated silicon oxide layer may be deposited within the openings 84 and overlying the hard masking layer 82, and then anisotropically etched using a procedure such as reactive ion etching (RIE) employing $CHF_3$, $CF_4$, or $SF_6$ chemistry, for example, to form oxide spacers 86 about the sidewalls of the hard masking layer 82.

Figure 3:
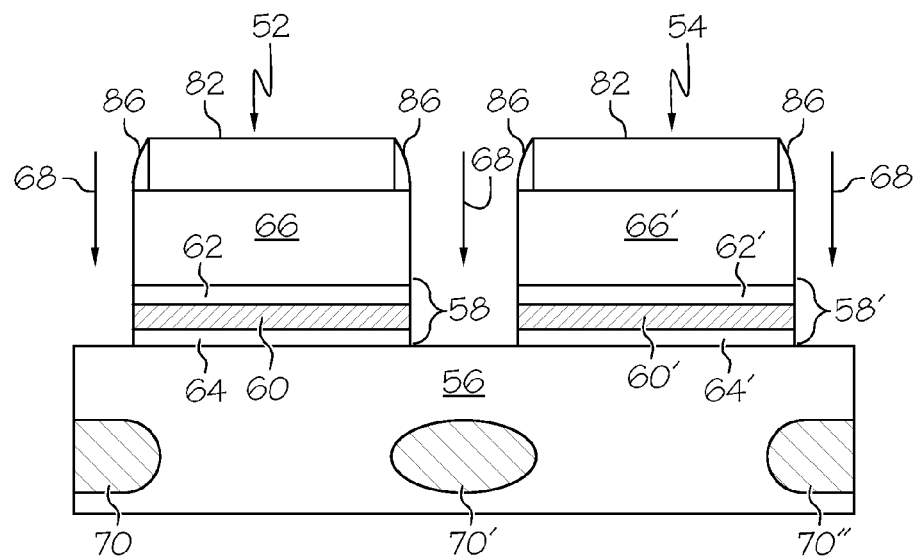

Referring now to FIG. 3, the control gate material layer 80 and the multi-layer stack 58 are etched by, for example, plasma etching in a Cl or $HBr/O_2$ chemistry, to form first and second gate stacks 52 and 54, with each gate stack having a control gate 66 and 66' respectively, and a multi-layer stack 58 and 58' respectively. As indicated by each of the arrows 68, oxygen is then implanted into the exposed regions of the silicon substrate 56. The implanted oxygen reacts with silicon in the substrate 56 to form silicon oxide regions 70, 70', and 70" (hereinafter referred to generally as 70). The implantation procedure is performed in a manner that will produce high oxygen concentrations beneath the substrate surface. In an exemplary embodiment the high oxygen concentrations that produce the silicon oxide regions 70 are formed at depths that are beneath regions that will subsequently be impurity doped to form bit line regions. An exemplary oxygen implantation step is performed at an energy range of between about 50 and about 250 KeV, producing silicon oxide regions 70, 70', and 70" at a depth raging between about 400 to about 3000 angstroms. A subsequent high temperature annealing step is preferably performed after the oxygen implantation step to cure any substrate damage that occurred during implantation. An exemplary annealing temperature is about 1000° C.

Figure 4:
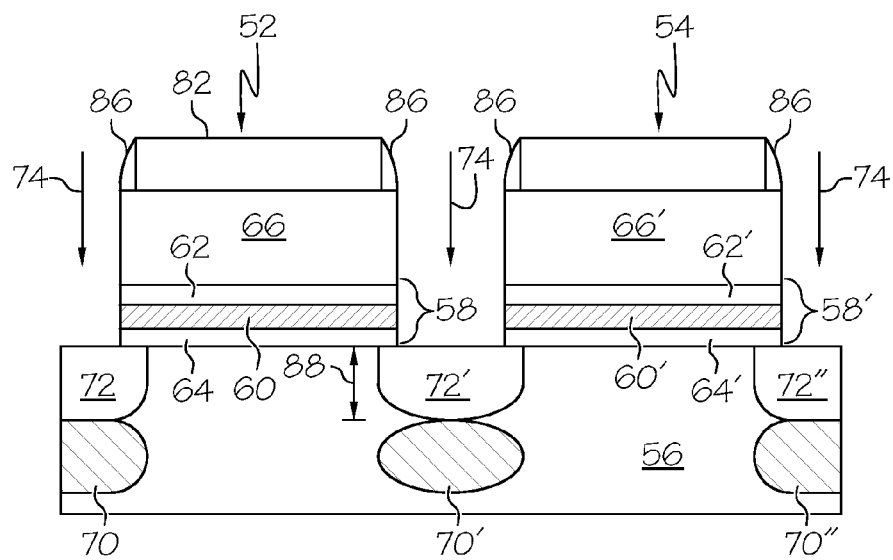

Referring to FIG. 4, the hard masking layers 82 and oxide spacers 86 formed on the gate stacks 52 and 54 are used as ion implantation masks in order to form impurity doped region or bit line regions 72, 72', and 72" (hereinafter referred to generally as 72) in the silicon substrate 56. As previously discussed, the bit line regions 72 are formed above the oxide regions 70. In an exemplary embodiment, ion implantation is performed to produce bit line regions 72 adjacent to the oxide regions 70 as illustrated in FIG. 4. Alternatively, the bit line regions 72 may be slightly spaced apart from the oxide regions 70. The bit line regions 72 are formed by implanting an N-type impurity dopant as indicated by arrows 74. An exemplary dopant includes arsenic ions or phosphorous ions, and is implanted using ion implant energy ranging between about 2 keV and about 30 keV, and preferably ranging between about 3 keV and about 20 keV. The bit line region 72 has a depth, illustrated by double-headed arrow 88, which may range between about 400 and about 1200 angstroms. Following the formation of the bit line regions 72, the hard masking layers 82 and any oxide spacers 86 are removed using conventional mask removal techniques.

Figure 5:
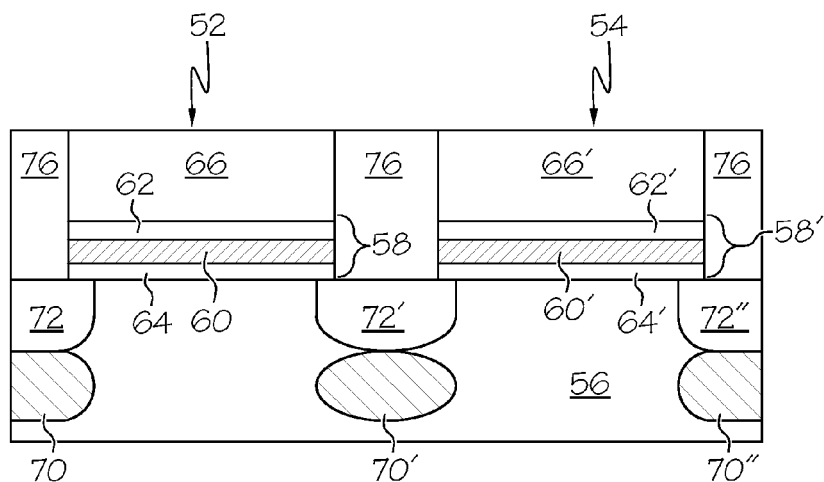

After forming the oxide regions 70 and bit line regions 72, the spaces between each of the gate stacks 52 and 54 are filled with an insulating material. As illustrated in FIG. 5, each side of the gate stacks 52 and 54 is separated by such an insulation material 76, which may include nonconductive oxide and/or nitride compounds such as silicon oxide, silicon nitride, and silicon oxynitride. In an exemplary embodiment, the insulation material 76 is deposited generally over all of the exposed surfaces, including both the bit line regions 72 and the control gates 66 and 66' that are exposed due to removal of the hard masking layers 82 and any oxide spacers 86. The device is then planarized using conventional processes such as chemical-mechanical polishing and/or etching to expose the control gates 66 and 66' so their upper surfaces are co-planar with the upper surfaces of the insulating material 76.

Figure 6:
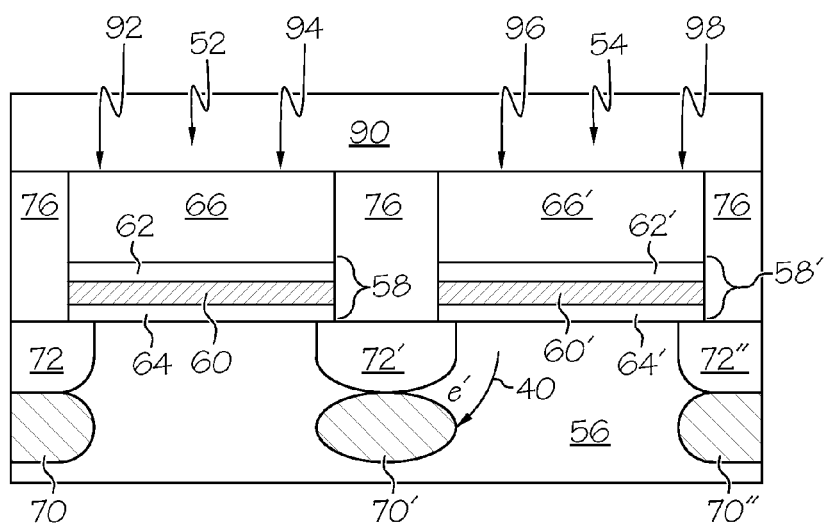

Finally, as illustrated in FIG. 6, word lines are formed over the gate stacks 52 and 54 in a direction orthogonal to the bit lines 72. For example, in FIG. 6 a word line 90 is illustrated as extending orthogonal to the bit lines 72, which are depicted being perpendicular to the plane of the page. There are numerous known methods for depositing and defining word lines using conductive materials such as doped polysilicon, any of which may be utilized to form the word lines 90 in accordance with the present invention.

A programming method for the memory cells 52 and 54 will now be described to exemplify the manner by which the oxide regions 70 beneath the bit lines 72 prevent transient program disturb when programming the dual bit memory cells 52 and 54 manufactured according to the present methods. Memory cell 52 includes two programmable bits 92 and 94, and the other illustrated memory cell 54 also includes two programmable bits 96 and 98. Programming one of the bits 92 in memory cell 52 is performed using a hot electron injection technique, during which electrons are injected into its charge trapping layer 60 while applying a bias between the bit lines 72 and 72' while applying a high voltage to the control gate electrode 66. In an exemplary embodiment, this is accomplished by grounding bit line 72' and applying approximately 3 to 5 V to bit line 72 and approximately 8 to 10 V to the control gate electrode 66 of memory cell 52. The voltage on the control gate electrode 66 inverts a channel region 100 while the bias accelerates electrons from the bit line 72 into the channel region 100 towards bit line 72'. The kinetic energy gain of the electrons is more than sufficient to surmount the energy baffler at channel region 100/tunnel oxide layer 64 interface and, while the electrons are accelerated towards the bit line 72', the field caused by the high voltage on the control gate 66 of memory cell 52 redirects the electrons towards the charge trapping layer 60 in the bit 94. Those electrons that cross the interface into the charge trapping layer 60 remain trapped for later reading.

Similarly, programming the second bit 94 by hot electron injection into the charge trapping layer 60 is performed by applying a bias between the bit lines 72' and 72 while applying a high voltage to the control gate 66 of memory cell 52. This may be accomplished by grounding bit line 72 and applying approximately 5V to bit line 72' and approximately 10 V to the control gate 66. The voltage on the control gate 66 inverts the channel region 100 while the bias accelerates electrons from bit line 72 into the channel region 100 towards bit line 72'. The field caused by the high voltage on the control gate 66 redirects the electrons toward the charge trapping layer 60 of the second bit 94. Those electrons that cross the channel region 100/tunnel oxide layer 64 into the charge trapping layer 60 remain trapped for later reading.

In a conventional device, transient program disturb may result due to hot holes that are generated when subsequently programming the first bit 96 of memory cell 54. Freed electrons resulting from the secondary impact ionization tend to diffuse, as depicted by arrow 40, toward the memory cell 52 by migrating beneath the gate 66 where they would be accelerated and injected into the charge trapping stack 58 of the second bit 94. However, the oxide region 70' captures the migrating electrons before they can reach and adversely affect the memory window of the second bit 94. In this way, the oxide region 70' enables manufacture of increasingly smaller memory devices while avoiding the obstacles associated with the transient program disturb phenomenon.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a dual-bit memory device comprising a first dual-bit memory cell and a second dual-bit memory cell, the method comprising the steps of:

forming a first gate stack of the first dual-bit memory cell and a second gate stack of the second dual-bit memory cell overlying a substrate, wherein the first gate stack and the second gate stack are each designed to store at least two bits of information;

forming an oxide region at a first depth within the substrate and between the first and second gate stacks, wherein the oxide region is formed in a region within the substrate that underlies both the first and second gate stacks and that is shared by the first and second gate stack;

forming an impurity doped region at a second depth within the substrate and between the first and second gate stacks to produce a shared bit line that is shared by both of the first and second gate stacks, and wherein the impurity doped region extends to and directly contacts the oxide region to prevent electrons from migrating between the first and second gate stacks, and wherein the first depth is lower than the second depth.

2. The method according to claim 1, wherein the step of forming the oxide region is performed before the step of forming the impurity doped region.

3. The method according to claim 1, wherein the shared bit line is a source or drain region that is shared by both of the first and second gate stacks.

4. The method according to claim 1, wherein the step of forming an impurity doped region forms the impurity doped region directly above the oxide region.

5. The method according to claim 1, wherein the step of forming the oxide region is performed at an energy level ranging between about 50 and about 250 KeV.

6. The method according to claim 1, farther comprising the step of:

annealing the substrate after the step of forming the oxide region.

7. The method according to claim 6, wherein the step of annealing the substrate comprises heating the substrate to about 1000°C.

8. The method according to claim 1, wherein the steps of forming the oxide region and the impurity doped region are performed such that the oxide region and the impurity doped region are adjacent within the substrate.

9. The method according to claim 1, wherein the step of forming the first gate stack and the second gate stack comprises the steps of:

forming a multilayer charge trapping stack on the substrate;

forming a control gate material layer overlying the charge trapping stack; and etching the control gate material and the charge trapping stack to form the first gate stack and the second gate stack.

10. The method according to claim 1, farther comprising the step of:
    forming a word line over the first and second gate stacks.

11. A dual-bit memory device, comprising:
    a substrate;
    a first dual-bit memory cell comprising a first gate stack overlying the substrate;
    a second dual-bit memory cell comprising a second gate stack overlying the substrate and spaced apart from the first gate stack, wherein the first gate stack and the second gate stack are each designed to store at least two bits of information;
    an oxide region formed at a first depth within the substrate and between the first and second gate stacks, wherein the oxide region is formed in a region within substrate that underlies both the first and second gate stacks and that is shared by the first and second gate stack;
    a shared bit line formed at a second depth within the substrate and between the first and second gate stacks, wherein the shared bit line extends to and directly contacts the oxide region to prevent electrons from migrating between the first and second gate stacks, and wherein the first depth is lower than the second depth.

12. The dual-bit memory device according to claim 11, wherein the shared bit line is a source or drain region that is shared by both of the first and second gate stacks.

13. The dual-bit memory device according to claim 11, wherein the shared bit line is formed directly above the oxide region.

14. The dual-bit memory device according to claim 11, wherein oxide region and the shared bit line are adjacent within the substrate.

15. The dual-bit memory device according to claim 11, wherein each of the first gate stack and the second gate stack comprises:
    a multilayer charge trapping stack on the substrate; and
    a control gate material layer overlying the charge trapping stack.

16. The dual-bit memory device according to claim 11, further comprising:
    a word line formed over the first and second gate stacks.

17. A method for fabricating a dual-bit memory device, the method comprising the steps of:
    providing a structure comprising: a substrate having a first dual-bit memory cell comprising a first gate stack overlying the substrate and a second dual-bit memory cell comprising a second gate stack overlying the substrate, and an oxide region at a first depth within the substrate and between the first and second gate stacks, wherein the oxide region is formed in a region within the substrate that underlies both the first and second gate stacks and that is shared by the first and second gate stacks, wherein the first gate stack and the second gate stack are each designed to store at least two bits of information; and
    blocking an electron migration path in the substrate by forming a shared bit line in the substrate that extends to and directly contacts the oxide region to prevent electrons from migrating between the first and second gate stacks, wherein the shared bit line is formed within the substrate between the first and second gate stacks and is shared by both of the first and second gate stacks, wherein the shared bit line is formed at a second depth within the substrate, wherein the first depth is lower than the second depth, and the shared bit line is formed directly above the oxide region such that the oxide region and the shared bit line are adjacent within the substrate.

18. The method according to claim 17, wherein the shared bit line is a source or drain region that is shared by both of the first and second gate stacks.

* * * * *